(12) United States Patent
Fujiwara et al.

(10) Patent No.: US 11,152,057 B2
(45) Date of Patent: Oct. 19, 2021

(54) SRAM MEMORY

(71) Applicant: Taiwan Semiconductor Manufacturing Company, Ltd., Hsinchu (TW)

(72) Inventors: Hidehiro Fujiwara, Hsinchu (TW); Cheng Chun Dai, Hsinchu (TW); Chih-Yu Lin, Hsinchu (TW); Yen-Huei Chen, Hsinchu (TW); Hiroki Noguchi, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/507,917

(22) Filed: Jul. 10, 2019

(65) Prior Publication Data

US 2020/0020390 A1    Jan. 16, 2020

Related U.S. Application Data

(60) Provisional application No. 16/507,917, filed on Jul. 16, 2018.

(51) Int. Cl.
*G11C 11/419* (2006.01)
*G11C 11/16* (2006.01)

(52) U.S. Cl.
CPC ........ *G11C 11/419* (2013.01); *G11C 11/1655* (2013.01); *G11C 11/1657* (2013.01)

(58) Field of Classification Search
CPC ...... G11C 11/41; G11C 11/412; G11C 11/419

USPC .............................................. 365/154, 189.11
See application file for complete search history.

(56) References Cited

U.S. PATENT DOCUMENTS

| | | | |
|---|---|---|---|
| 5,379,247 A | 1/1995 | Kuriyama et al. | |
| 5,894,434 A | 4/1999 | Tran | |
| 5,946,263 A * | 8/1999 | Takahashi | G11C 8/14 365/230.06 |
| 6,404,670 B2 | 6/2002 | Shau | |
| 6,567,329 B2 | 5/2003 | Somasekhar et al. | |
| 6,917,560 B2 | 7/2005 | Nii | |
| 7,260,018 B2 | 8/2007 | Nii | |
| 9,806,083 B2 | 10/2017 | Mojumder et al. | |
| 9,886,996 B2 | 2/2018 | Fujiwara et al. | |
| 2011/0242882 A1* | 10/2011 | Asayama | H01L 27/0207 365/154 |
| 2013/0141992 A1* | 6/2013 | Lee | G11C 14/0054 365/189.14 |
| 2017/0255552 A1 | 9/2017 | Chatterjee et al. | |

FOREIGN PATENT DOCUMENTS

| | | |
|---|---|---|
| CN | 1383153 A | 12/2002 |
| CN | 1542971 A | 11/2004 |
| CN | 1599938 A | 3/2005 |
| CN | 1783341 A | 6/2006 |
| CN | 105261391 A | 1/2016 |

(Continued)

*Primary Examiner* — Alfredo Bermudez Lozada
(74) *Attorney, Agent, or Firm* — Merchant & Gould P.C.

(57) ABSTRACT

A static random access memory (SRAM) circuit can group the column bit lines in a memory array into subsets of bit lines, and a y-address signal input is provided for each subset of bit lines. Additionally or alternatively, each row in the array of memory cells is operably connected to multiple word lines.

20 Claims, 5 Drawing Sheets

(56) References Cited

FOREIGN PATENT DOCUMENTS

| | | | |
|---|---|---|---|
| CN | 107004432 | A | 8/2017 |
| CN | 107017018 | A | 8/2017 |
| TW | 201721638 | A | 6/2017 |

\* cited by examiner

SRAM MEMORY

CROSS-REFERENCE TO RELATED APPLICATION(S)

This application claims priority to U.S. Provisional Application No. 62/698,649 entitled "SRAM Memory," filed on Jul. 16, 2018, of which the entire disclosure is hereby incorporated by reference in its entirety.

BACKGROUND

Different types of memory circuits are used in electronic devices for various purposes. Read only memory (ROM) and random access memory (RAM) are two such types of memory circuits. A ROM circuit permits data to be read from, but not written to, the ROM circuit and retains its stored data when power is switched off. As such, a ROM circuit is typically used to store programs that are executed when the electronic device is turned on.

Unlike ROM circuits, a RAM circuit allows data to be written to, and read from, selected memory cells in the RAM circuit. One type of a RAM circuit is a static random access memory (SRAM) circuit. A typical SRAM circuit includes an array of addressable memory cells arranged in columns and rows. In some instances, the memory cells in a row can be accessed faster than the memory cells in a column. For example, only one access cycle may be needed to access the memory cells in a row because one word line is enabled or activated to access the memory cells. However, numerous access cycles can be required to access the memory cells in a column because multiple word lines must be activated to access the memory cells. Multiple access cycles may also be required when accessing a matrix of memory cells (e.g., an 8×8 matrix) in the array and the data in the matrix are located in different rows of the memory array.

Furthermore, in some electronic devices, the design and operation of a memory circuit can adversely affect the throughput of the computing system. Processor speeds have improved significantly over time, while there have been more limited improvements in memory transfer rates. As a result, a processor may spend an amount of time idle waiting for data to be retrieved from memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
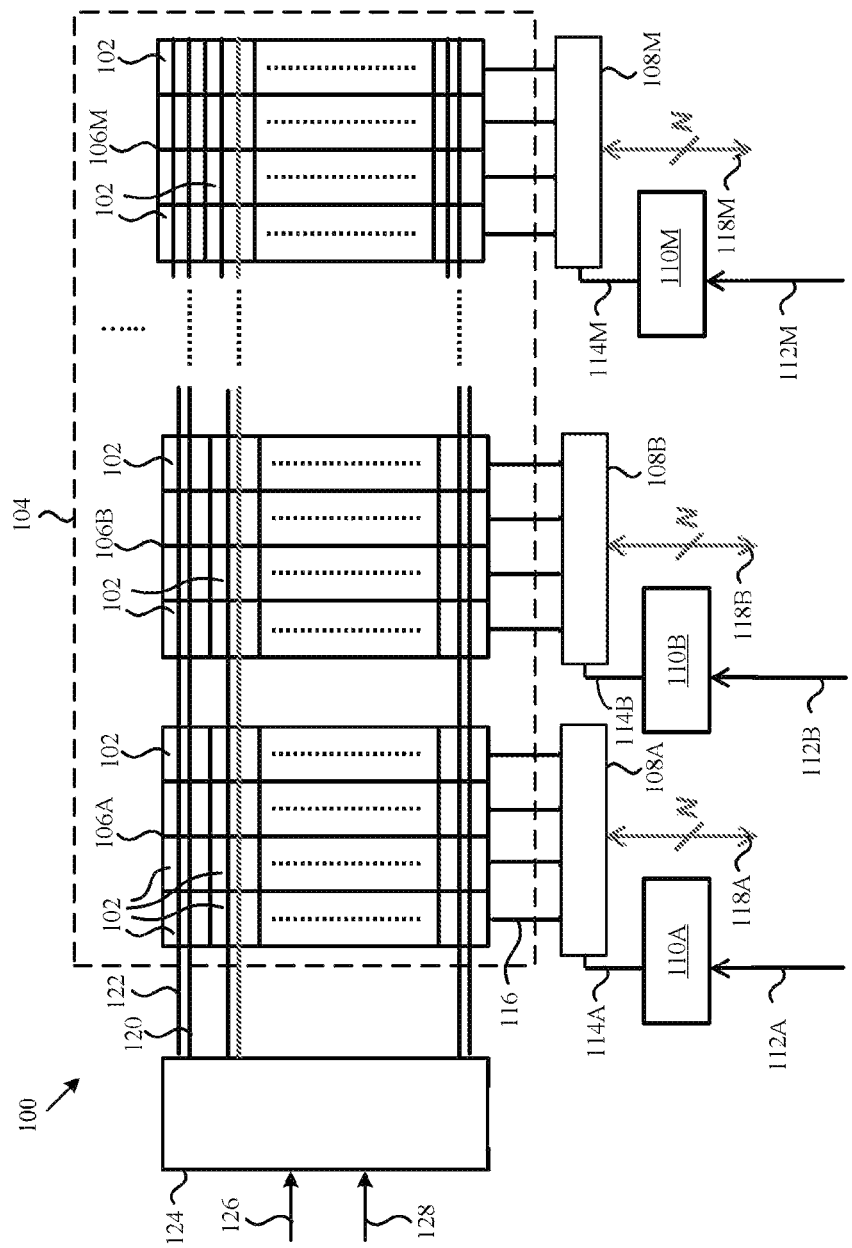
FIG. 1 illustrates a block diagram of a portion of a static random access memory circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein disclose a static random access memory (SRAM) circuit that provides simultaneous independent activation of word lines and/or simultaneous independent activation of bit lines. This allows memory cells in multiple rows and multiple columns to be selected concurrently for read and/or write operations. The SRAM circuit includes a y-address signal input for two or more subsets of columns in an array of memory cells (e.g., two or more blocks of memory cells). In some embodiments, a y-address signal input is provided per $2^n$ bit lines, where n is equal to or greater than one. For example, a y-address signal input can be provided for 2, 4, 8, 16, 32, or 64 bit lines.

Additionally or alternatively, the SRAM circuit includes multiple word lines operably connected to each row of memory cells in the SRAM circuit. For example, a pair of word lines may be connected to each row. The connections between the access transistors in each memory cell and the first and the second word lines varies within each row. For example, first and second access transistors in one memory cell in a row may be connected to one word line and the first and the second access transistors in another memory cell in that row can be connected to the other word line. Alternatively, in one memory cell in a row, the first access transistor may be connected to a first word line and the second access transistor in the memory cell can be connected to the second word line. In another memory cell in the row, the connections between the first and the second access transistors can be reversed. The first access transistor may be connected to the second word line and the second access transistor can be connected to the first word line.

Embodiments of the SRAM circuit support segment free data access. Additionally, memory cells can be accessed by rows (e.g., horizontal direction) and by columns (e.g., vertical direction). In some instances, this flexible data access can reduce the amount of time that a processor is idle and waiting for data to be retrieved from the memory. Additionally, the flexible data access may be used in a variety of applications, including, but not limited to, imaging process applications including convolution neural networks.

FIG. 1 illustrates a block diagram of a portion of a static random access memory circuit in accordance with some embodiments. In the illustrated embodiment, the SRAM circuit 100 includes memory cells 102 that are arranged in rows and columns to form a memory array 104. The SRAM circuit 100 can include any suitable number of rows and columns. For example, an SRAM circuit includes R number of rows and C number of columns, where R is an integer greater than or equal or one and C is a number greater than or equal to two.

The memory cells 102 can be logically and/or physically organized into M blocks 106A, 106B, . . . , 106M of memory cells 102 (collectively referred to as block 106), where M is greater than or equal to one. Any suitable number of memory cells 102 is included in a block 106. In some instances, the number of memory cells 102 in a block 106 is determined by $2^i$, where i is a number that is greater than or equal to 1. For example, a block 106 can be implemented as an 8×8 block of memory cells (e.g., where n=6 and $2^6$=64 memory cells arranged in eight rows and eight columns) or a 16×16 block of memory cells (e.g., where n=8 and $2^8$=256 memory cells arranged in sixteen rows and sixteen columns). Although FIG. 1 depicts three blocks 106 of memory cells 102, embodiments can include any suitable number of blocks 106 of memory cells 102, any suitable number of memory cells 102, and any suitable number of memory cells 102 in each block 106.

Each block 106 is operably connected to a column select circuit 108A, 108B, . . . , 108M (collective referred to as column select circuit 108). One example of a column select circuit 108 is a multiplexer. Each column select circuit 108 is operably connected to a y-decoder circuit 110A, 110B, . . . , 110M (collectively y-decoder circuit 110). Each y-decoder circuit 110 receives a y-address signal 112A, 112B, . . . , 112M and generates a y-select signal 114A, 114B, . . . , 114M for a respective column select circuit 108 (collectively referred to as y-address signal 112 and y-select signal 114). Each column select circuit 108 selects a column (a "bit line") in a block based on the y-select signal 114 and digit line pair signals 118A, 118B, . . . , 118M (an illustrative bit line is designated by 116).

In the illustrated embodiment, each row of memory cells in the memory array 104 is operably connected to a first word line and a second word line (first word lines collectively 120 and second word lines collectively 122). The number of first word lines corresponds to R, the number of rows. Similarly, the number of second word lines corresponds to R. Accordingly, in one non-limiting example, the total number of word lines operably connected to a memory array may correspond to 2×R. In other embodiments, the memory cells in a row can be operably connected to three or more word lines.

An x-decoder circuit 124 is operably connected to the first and the second word lines 120, 122. Although only one x-decoder circuit is shown in FIG. 1, other embodiments can include multiple x-decoder circuits with each x-decoder circuit operably connected to a subset of the word lines. Thus, the x-decoder circuit 124 represents one or more x-decoder circuits.

The x-decoder circuit 124 receives a first x-address signal 126 and generates a first x-select signal on a selected first word line 120. The x-decoder circuit 124 receives a second x-address signal 128 and generates a second x-select signal on a selected second word line 122. For each selected first word line 120 and a corresponding selected bit line 116, a first memory cell 102 in a block 106 is selected for access (e.g., read or write operation). Similarly, for each selected second word line 122 and a corresponding selected bit line 116, a second memory cell 102 in a block 106 is selected for access (e.g., read or write operation). The second memory cell 102 can be in the same block (e.g., block 106A, 106B, . . . , 106M) as the first memory cell 102 or in a different block.

In some aspects, the SRAM circuit 100 includes a y-address signal input for subsets of columns or bit lines in the memory array. For example, in FIG. 1, the y-address signal lines 112A, 112B, . . . , 112M are provided for respective blocks 106A, 106B, . . . , 106M, where each block 106A, 106B, 106M includes a subset of the bit lines 116. In some embodiments, each block includes $2^n$ bit lines, where n is equal to or greater than one. This allows multiple bit lines 116 to be selected and activated independently and simultaneously.

Additionally, each row in the SRAM circuit 100 is operably connected to multiple word lines (e.g., word lines 120, 122). The word lines 120, 122 can be independently and simultaneously selected and activated. When combined with the independent and simultaneous activation of multiple bit lines 116, multiple memory cells 102 in the memory array 104 can be accessed for a write operation or a read operation (the multiple memory cells 102 can be in the same or in different blocks (e.g., blocks 106A, 106B, . . . , 106M)).

Figure 2:
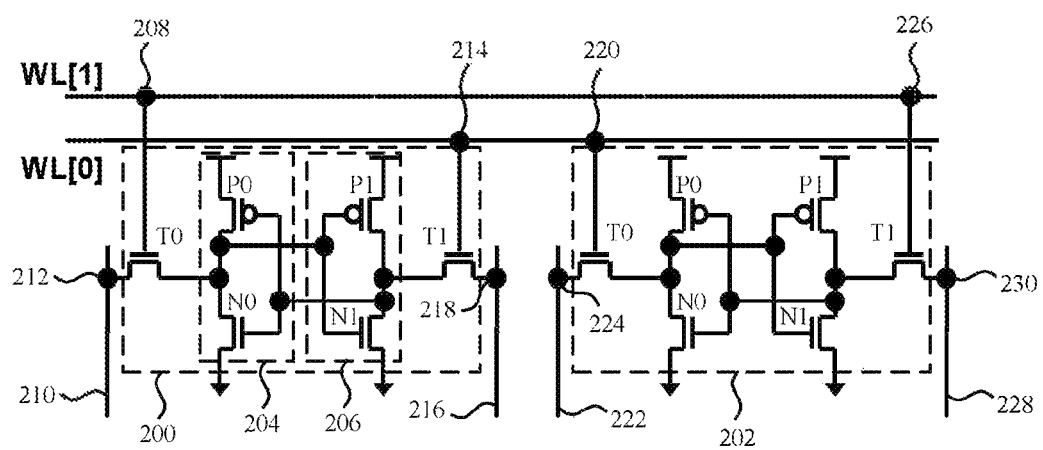
FIG. 2 depicts a schematic diagram of a first example of two memory cells suitable for use in the SRAM circuit shown in FIG. 1 in accordance with some embodiments.

FIG. 2 depicts a schematic diagram of a first example of two memory cells suitable for use in the SRAM circuit shown in FIG. 1 in accordance with some embodiments. Each memory cell 200, 202 is shown as a six-transistor (6T) memory cell, although other embodiments are not limited to this configuration. For example, each memory cell 200, 202 may be a four-transistor (4T) memory cell. In the illustrated embodiment, the first word line WL[0] and the second word line WL[1] correspond to the first and the second word lines 120, 122 in FIG. 1, the memory cells 200, 202 correspond to the memory cells 102, and the bit lines 210, 216, 222, 228 correspond to the bit lines 116 in FIG. 1.

Each memory cell 200, 202 includes a first cross-coupled inverter 204 operably connected to a second cross-coupled inverter 206. The first cross-coupled inverter 204 is connected to a first access transistor T0 and the second cross-coupled inverter 206 is connected to a second access transistor T1. In the illustrated embodiment, each cross-coupled inverter 204, 206 includes a p-type metal oxide semiconductor (PMOS) transistor (e.g., P0 and P1) operably connected to an NMOS transistor (e.g., N0 and N1). A source terminal of the PMOS transistor is operably connected to a supply voltage and a drain terminal of the PMOS transistor is operably connected to a drain terminal of the NMOS transistor. The source terminal of the NMOS transistor is operably connected to a reference voltage. A gate terminal of the PMOS transistor P1 is operably connected to the drain terminal of NMOS transistor N0. Similarly, a gate terminal of PMOS transistor P0 is operably connected to the drain terminal of NMOS transistor N1 The cross-coupled inverters 204, 206 form a storage unit having two stable states that are used to denote a 0 and a 1.

The access transistors T0, T1 control access to the storage unit during read and write operations. The two access transistors T0, T1 enable a bit to be read from, or written to, the memory cell 200, 202. This type of SRAM memory cell is referred to as a single port memory cell, and the SRAM circuit is known as a single port SRAM circuit. Other embodiments are not limited to this implementation. For example, a memory cell 200, 202 may be a dual port SRAM memory cell.

In the illustrated embodiment, the access transistors T0, T1 are NMOS transistors. In the first memory cell 200, the gate of the first access transistor T0 is operably connected to the second word line WL[1] at node 208. The source of the first access transistor T0 is operably connected to a bit line 210 at node 212 and the drain of the first access transistor T0 is operably connected to the drain of the NMOS transistor N0. With respect to the second access transistor T1 in the first memory cell 200, the gate of the second access transistor T1 is operably connected to the first word line WL[0] at node 214. The drain of the second access transistor T1 is operably connected to the drain of the NMOS transistor N1 and the source of the second access transistor T1 is operably connected to a bit line 216 at node 218.

In the second memory cell 202, the gate of the first access transistor T0 is operably connected to the first word line WL[0] at node 220. The source of the first access transistor T0 is operably connected to a bit line 222 at node 224 and the drain of the first access transistor T0 is operably connected to the drain of the NMOS transistor N0. With respect to the second access transistor T1 in the second memory cell 202, the gate of the second access transistor T1 is operably connected to the second word line WL[1] at node 226. The drain of the second access transistor T1 is operably connected to the drain of the NMOS transistor N1 and the source of the second access transistor T1 is operably connected to a bit line 228 at node 230.

In the embodiment of FIG. 2, the gates of the access transistors T0, T1 in each memory cell 200, 202 are selectively connected to either the first or the second word line WL[0], WL[1]. In each row in a block or in the memory array (e.g., block 106 or memory array 104 in FIG. 1), the gate of the first access transistor T0 in the memory cell 200 is connected to the second word line WL[1], and in the immediately adjacent memory cell 202, the gate of the first access transistor T0 is connected to the first word line WL[0]. Similarly, in the same row, the gate of the second access transistor T1 in the first memory cell 200 is connected to the first word line WL[0], and the gate of the second access transistor T1 in the second memory cell 202 is connected to the second word line WL[1]. In one embodiment, the memory cell 200 is in an even numbered column and the memory cell 202 is in an odd numbered column. In another embodiment, the memory cell 200 is in an odd numbered column and the memory cell 202 is in an even numbered column.

Figure 3:
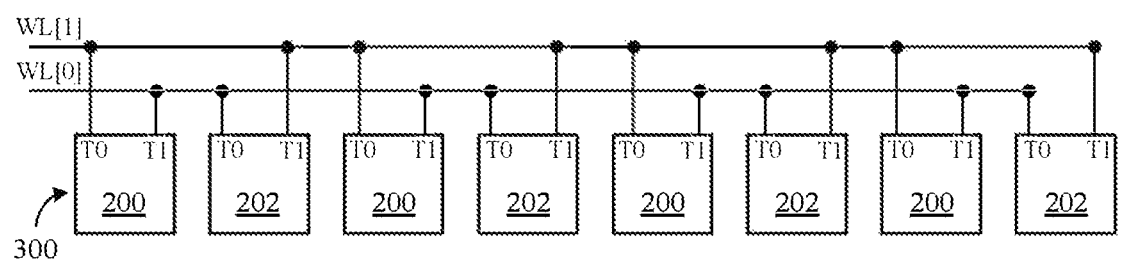
FIG. 3 illustrates an example first word line connection pattern between two word lines and a row of memory cells for the embodiment shown in FIG. 2.

FIG. 3 illustrates an example first word line connection pattern between two word lines and a row of memory cells for the embodiment shown in FIG. 2. The row 300 is a row in a block or a row in a memory array (e.g., block 106 or memory array 104 in FIG. 1). The connections between the first and the second access transistors T0, T1 in the memory cells 220, 202 and the first and the second word lines WL[0], WL[1] varies within the row 300 of memory cells 200, 202.

In the non-limiting example of FIG. 3, the row 300 includes eight memory cells 200, 202. In that row 300, the gates of a first set of second access transistors T1 in the memory cells 200 are connected to the first word line WL[0], and the gates of a first set of first access transistors T0 in the same memory cells 200 are connected to the second word line WL[1]. In the memory cells 202 that are immediately adjacent the memory cells 200 (e.g., memory cells 202 are interposed between memory cells 200), the gates of a second set of second access transistors T1 are connected to the second word line WL[1] and the gates of a second set of first access transistors T0 in the same memory cells 202 are connected to the first word line WL[0].

Thus, in the first word line connection pattern, the gate of one access transistor in a memory cell is connected to one word line and the gate of the other access transistor in the same memory cell is connected to the other word line, and the word line connections alternate every other memory cell 200, 202 in the row 300. The first word line connection pattern can extend across the entire row 300, or the row 300 in at least one block (e.g., block 106 in FIG. 1) may have a different word line connection pattern. For example, the row 300 in one block may have the first word line connection pattern shown in FIG. 2, while the word line connection pattern in another block can differ in that the gates of the first set of second access transistors T1 in the memory cells 200 may be connected to the second word line WL[1], the gates of the first set of first access transistors T0 in the same memory cells 200 can be connected to the first word line WL[0], the gates of the second set of second access transistors T1 in the memory cells 202 be connected to the first word line WL[0], and the gates of the second set of first access transistors T0 in the same memory cells 202 can be connected to the second word line WL[1].

Additionally or alternatively, each row in the memory array can have the first word line connection pattern, or the word line connection pattern can differ for at least one row in the memory array. For example, one row in the memory array can have the first word line connection pattern shown in FIG. 2. Another row in the memory array can have a different word line connection pattern. In a non-limiting example, the different word line connection pattern can connect the gates of the first set of second access transistors T1 in the memory cells 200 to the second word line WL[1], the gates of the first set of first access transistors T0 in the same memory cells 200 to the first word line WL[0], the gates of the second set of second access transistors T1 in the memory cells 202 to the first word line WL[0], and the gates of the second set of first access transistors T0 in the same memory cells 202 to the second word line WL[1].

Figure 4:
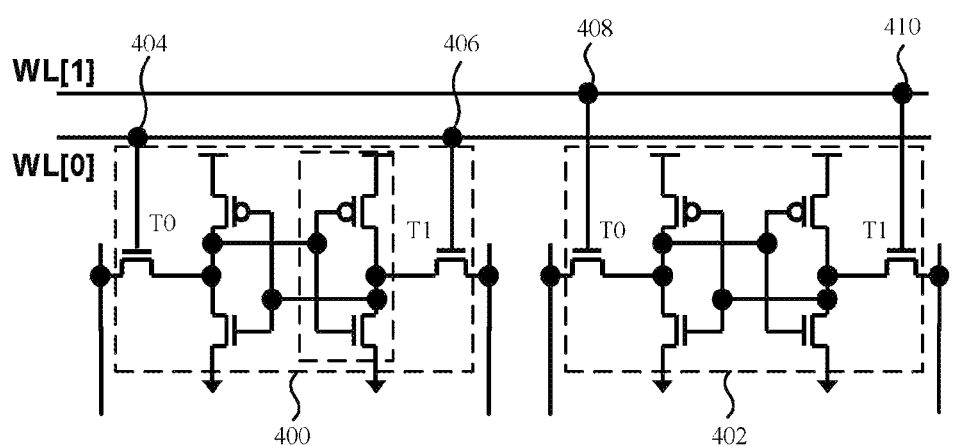
FIG. 4 depicts a schematic diagram of a second example of two memory cells suitable for use in the SRAM circuit shown in FIG. 1 in accordance with some embodiments.

FIG. 4 depicts a schematic diagram of a second example of two memory cells suitable for use in the SRAM circuit shown in FIG. 1 in accordance with some embodiments. Each memory cell 400, 402 is shown as a six-transistor (6T) memory cell, although other embodiments are not limited to this configuration. In the illustrated embodiment, the first word line WL[0] and the second word line WL[1] correspond to the first and the second word lines 120, 122 in FIG. 1, and the memory cells 400, 402 correspond to the memory cells 102.

The first and the second memory cells 400, 402 are the same as the first and the second memory cells 200, 202 in FIG. 2 except for the connections between the first and the second word lines WL[0], WL[1] and the gates of the first and the second access transistors T0, T1. In the first memory cell 400, the gates of the first and the second access transistors T0, T1 are operably connected to the first word line WL[0] at nodes 404, 406, respectively. In the immediately adjacent second memory cell 402, the gates of the first and the second access transistors T0, T1 are operably connected to the second word line WL[1] at nodes 408, 410, respectively. In one embodiment, the memory cell 400 is in an even numbered column and the memory cell 402 is in an odd numbered column. In another embodiment, the memory cell 400 is in an odd numbered column and the memory cell 402 is in an even numbered column.

Figure 5:
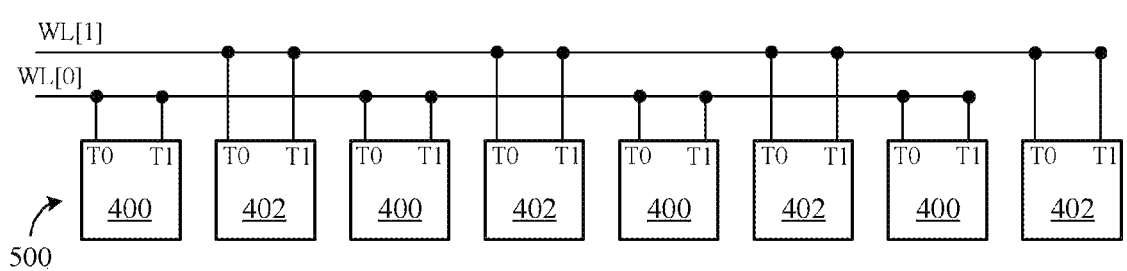
FIG. 5 illustrates an example second word line connection pattern between two word lines and a row of memory cells for the embodiment shown in FIG. 4.

FIG. 5 illustrates an example second word line connection pattern between two word lines and a row of memory cells for the embodiment shown in FIG. 4. The row 500 is a row in a block or a row in a memory array (e.g., block 106 or memory array 104 in FIG. 1). The connections between the first and the second access transistors T0, T1 in the memory cells 400, 402 and the first and the second word lines WL[0], WL[1] varies within the row 500 of memory cells 400, 402.

In the non-limiting example of FIG. 5, the row 500 includes eight memory cells. In that row 500, the gates of a first set of first access transistors T0 and the gates of a first set of second access transistors T1 in the memory cells 400 are connected to the first word line WL[0]. In the memory cells 402 that are immediately adjacent the memory cells 400 (memory cells 402 are interposed between memory cells 400), the gates of a second set of first access transistors T0 and the gates of a second set of second access transistors T1 are connected to the second word line WL[1]. Thus, in the second word line connection pattern, the gates of both access transistors T0, T1 in the memory cells 400 are connected to one word line (the same word line), and the gates of both access transistors T0, T1 in the memory cells 402 are connected to the other word line. The connections between the access transistors T0, T1 in a memory cell 400, 402 and the word lines WL[0], WL[1] alternate every other memory cell 400, 402 in the row 500.

The second word line connection pattern can extend across the entire row 500, or the memory cells in in at least one block (e.g., block 106 in FIG. 1) may have a different connection pattern. For example, the second word line connection pattern can be implemented in a first block associated with the row 500 while a different word line connection pattern is used in a second block associated with the row 500. For example, the word line connection pattern can differ in the second block in that the word line connection pattern is reversed (e.g., the gates of both access transistors in the first memory cell 400 are connected to the second word line WL[1] and the gates of both access transistors in the second memory cell 402 are connected to the first word line WL[0]). Alternatively, the gates of the access transistors in the second block (e.g., block 106 in FIG. 1) can be connected to the word lines WL[0], WL[1] according to the first word line connection pattern.

Additionally or alternatively, each row in the memory array can have the second word line connection pattern, or the connection pattern can differ for at least one row in the memory array. For example, one row in the memory array can have the second word line connection pattern (FIG. 4) and another row in the memory array can have a different word line connection pattern (e.g., the first word line connection pattern shown in FIG. 2).

Other word line connection patterns may be used in other embodiments. For example, the first word line connection pattern shown in FIG. 2 can be modified such that the connections between the gates of the access transistors T0, T1 and the word lines WL[0], WL[1] may alternate every two memory cells. In another example, the second word line connection pattern shown in FIG. 4 can be modified such that the connections between the gates of the access transistors T0, T1 and the word lines WL[0], WL[1] may alternate every two memory cells. Any word line connection pattern that varies the connections between the word lines and the access transistors across the rows and enables independent access of the memory cells may be used.

Figure 6:
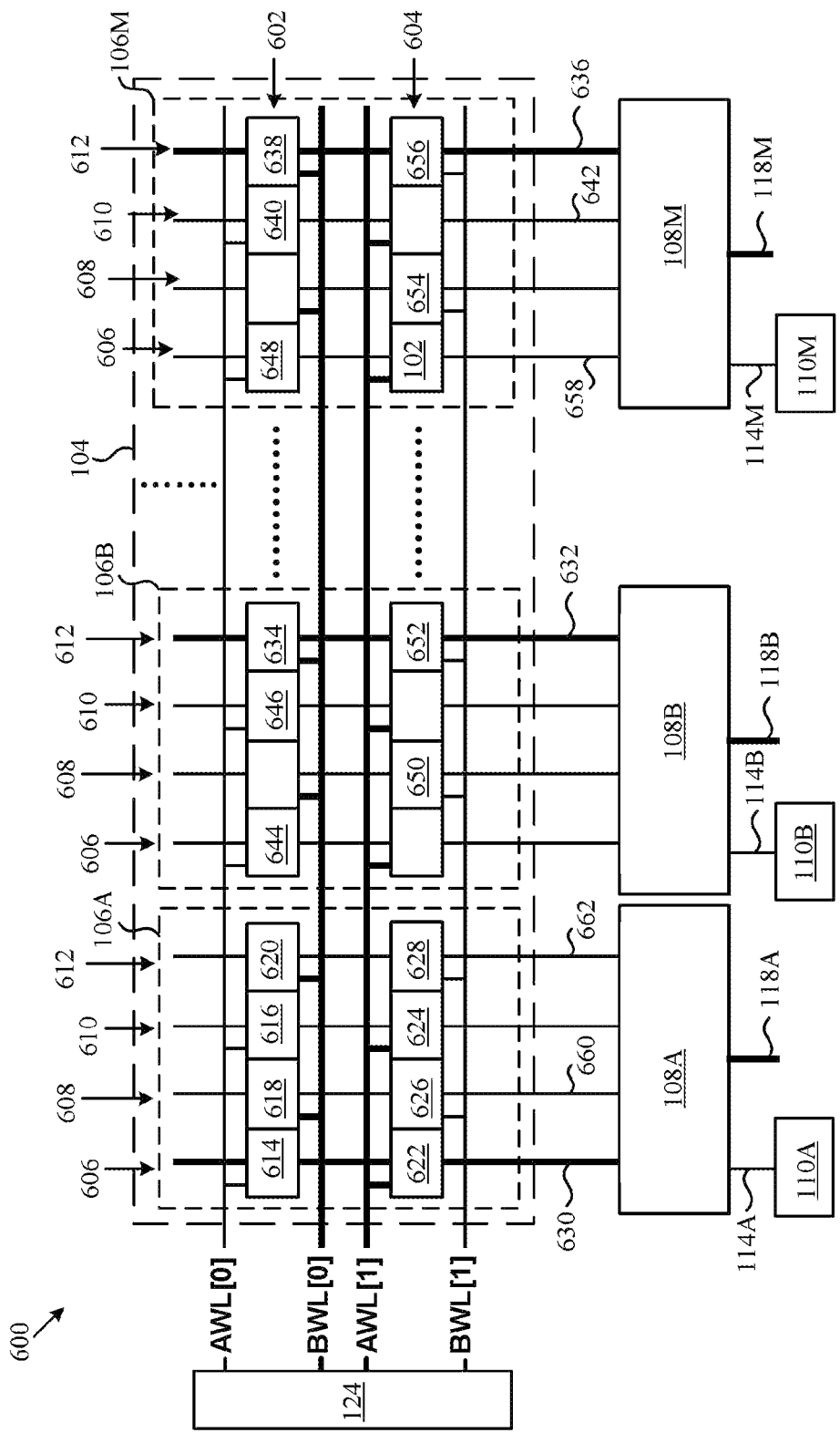
FIG. 6 depicts a schematic diagram of a third example of an SRAM circuit in accordance with some embodiments.

FIG. 6 depicts a schematic diagram of a third example of an SRAM circuit in accordance with some embodiments. FIG. 6 is similar to FIG. 1 but illustrates the connections between the memory cells and the word lines in more detail. In the illustrated embodiment, the word lines AWL[0] and AWL[1] correspond to the second word lines 122 in FIG. 1 and the word lines BWL[0] and BWL[1] correspond to the first word lines 120.

The SRAM circuit 600 is depicted with M blocks 106A, 106B, . . . , 106M (collectively block 106) of memory cells 102 in the memory array 104. The memory array 104 includes any suitable number of rows and columns. In the illustrated embodiment, each block 106 includes two rows 602, 604 of memory cells 102 and four columns 606, 608, 610, 612 of memory cells 102 for a total of eight memory cells 102 in each block 106.

An x-decoder circuit 124 is operably connected to the word lines AWL[0], BWL[0], AWL[1], BWL[1]. A first pair of word lines AWL[0], BWL[0] is operably connected the row 602 and a second pair of word lines AWL[1], BWL[1] is operably connected the row 604. With respect to the row 602, the first pair of word lines AWL[0], BWL[0] is operably connected to alternate memory cells. For example, the word line AWL[0] is operably connected to memory cells 614, 616 and the word line BWL[0] is operably connected to the memory cells 618, 622.

With respect to the row 604, the second pair of word lines AWL[1], BWL[1] is operably connected to alternate memory cells. For example, the word line AWL[1] is operably connected to memory cells 622, 624 and the word line BWL[1] is operably connected to the memory cells 626, 628. In a non-limiting embodiment, the first pair of word lines AWL[0], BWL[0] and the second pair of word lines AWL[1], BWL[1] are operably connected to the memory cells 614, 616, 618, 620, 622, 624, 626, 628 according to the second word line connection pattern shown in FIG. 4.

Since the word line connections in FIG. 6 correspond to the second word line pattern shown in FIG. 4, activating one word line (e.g., word line AWL[0]) operably connected to a row enables or activates the gates of the first and the second access transistors (e.g., first access transistor T0 and second access transistor T1 in FIGS. 4 and 5) in a first subset of the memory cells 102 in the row. For example, when the word line AWL[0] is activated, the memory cells 614, 616 are selected, while activating the other word line (e.g., BWL[0]) operably connected to the same row (e.g., row 602) activates the gates of the first and the second access transistors in a second subset of the memory cells 102 in the same row. When combined, the first and the second subsets of memory cells comprise all of the memory cells in the row (e.g., row 602). Alternatively, activating one word line operably connected to a first row (e.g., row 602) activates the gates of the first and the second access transistors in a subset of the memory cells in the first row while activating a second word line operably connected to a second row (e.g., row 604) activates the gates of the first and the second access transistors in a subset of the memory cells in the second row.

An example embodiment of accessing select memory cells 102 in the memory array 104 is now described. In FIG. 6, activation of word and bit lines is represented by bolded word and bit lines. A first x-address signal is received by the x-decoder circuit 124 to activate the word line BWL[0] and a second x-address signal is received by the x-decoder circuit 124 to activate the word line AWL[1]. A first y-address signal is received by the y-decoder circuit 110A to produce a first y-select signal on line 114A. The column select circuit 108A activates the bit line 630 based on the y-select signal 114A and the digit line pair signals 118A. The memory cell 622 is selected and accessed for a read or a write operation based on the activations of the word line AWL[1] and the bit line 630.

Continuing with the non-limiting example, a second y-address signal is received by the y-decoder circuit 110B to produce a second y-select signal on line 114B. The column select circuit 108B activates a second bit line 632 based on the y-select signal 114B and the digit line pair signal 118B. The memory cell 634 is selected and accessed for a read or a write operation based on the activations of the word line BWL[0] and the bit line 632.

A third y-address signal can be received by the y-decoder circuit 110M to produce a third y-select signal on line 114M. The column select circuit 108M activates the bit line 636 based on the y-select signal 114M and the digit line pair signals 118M. The memory cell 638 is selected and accessed for a read or a write operation based on the activations of the word line BWL[0] and the bit line 636.

In FIG. 6, additional or different memory cells 102 can be selected and accessed by independently activating select word lines and bit lines. For example, memory cell 640 is selected and accessed for a read or a write operation based on the activations of the word line AWL[0] and the bit line 642.

Embodiments described herein can select different subsets of memory cells based on which word lines are activated. For example, in FIG. 6, when the word line AWL[0] is activated, the memory cells 614, 616, 640, 644, 646, 648 are selected and form a subset of selected memory cells. Additionally or alternatively, when the word line BWL[1] is asserted, the memory cells 626, 628, 650, 652, 654, 656 are selected and constitute a subset of selected memory cells. Thus, depending on which word lines are activated, multiple subsets of selected memory cells can be selected, with the subsets residing in the same row or in different rows.

Additionally, when one or more word lines are activated, embodiments can access different subsets of memory cells for read or write operations based on which bit lines are asserted. For example, in FIG. 6, when the word line AWL[0] is activated and the bit lines 630, 658 are asserted, the memory cells 614, 648 are accessed for read or write operations and the memory cells 614, 648 form a subset of accessed memory cells. Additionally, when the word line BWL[1] is asserted and the bit lines 660, 632 are asserted, the memory cells 626, 652 are accessed for read or write operations. The memory cells 626, 652 constitute a subset of accessed memory cells.

Alternatively, when the word line BWL[l] is asserted and the bit lines 636, 660 are asserted, the memory cells 656, 626 are accessed for read or write operations and form a subset of accessed memory cells. Thus, depending on which word lines and which bit lines are activated, a subset of accessed memory cells is: (1) in the same row and operably connected to the same group of column output circuits (e.g., column output circuits associated with column select circuit 108A); (2) in the same row and operably connected to different groups of column output circuits (e.g., column output circuits associated with column select circuits 108A and 108B); (3) in different rows and operably connected to the same group of column output circuits; and/or (4) in different rows and operably connected to different groups of column output circuits. Independent access of one or more subsets of accessed memory cells for read or write operations can also be performed when one or more bit lines are asserted and then one or more word lines are activated.

Figure 7:
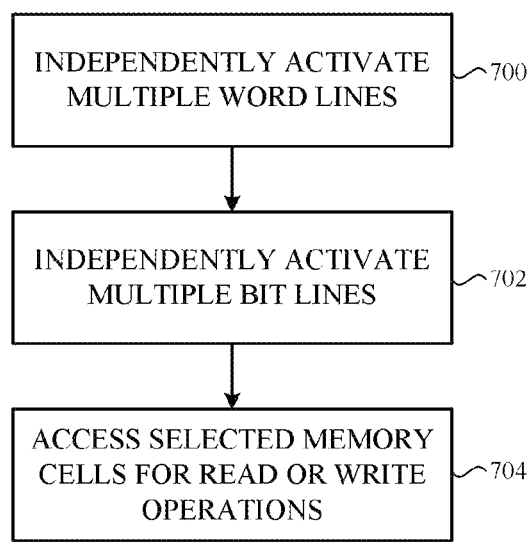
FIG. 7 illustrates is a flowchart of an example method of operating a SRAM circuit in accordance with some embodiments.

FIG. 7 illustrates a flowchart of an example method of operating a SRAM circuit in accordance with some embodiments. Initially, as shown in block 700, multiple word lines are independently activated. The multiple word lines can be operably connected to the same row or to different rows in a memory array.

Next, as shown in block 702, multiple bit lines are independently activated. The bit lines can be associated with the same or with different blocks of memory cells (e.g., block 106 in FIG. 1). Based on the activations of the multiple word lines and the multiple bit lines, certain memory cells in the memory array are selected and accessed for read or write operations at block 704.

The embodiments disclosed herein provide SRAM circuits that can access memory cells in the same and/or in different blocks of memory cells by concurrently and independently activating select word lines and concurrently and independently activating select bit lines. The select memory cells are in different columns and can be in the same row or in different rows. This produces an SRAM circuit that is more flexible in addressing and accessing memory cells. In some instances, it reduces the amount of time needed to access multiple memory cells.

Although the blocks shown in FIG. 7 are shown in a particular order, in other embodiments the order of the blocks can be arranged differently. For example, blocks 704 and 706 can be performed before blocks 700 and 702. Alternatively, blocks 700 and 704 may be performed before block 702.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

A static random access memory (SRAM) circuit includes a row of memory cells in a memory array, where the row includes a plurality of memory cells. A first word line is operably connected to a first subset of memory cells in the plurality of memory cells. A second word line is operably connected to a second subset of different memory cells in the plurality of memory cells. In one embodiment, the first subset of memory cells and the second subset of memory cells include all of the memory cells in the row.

A static random access memory (SRAM) circuit includes a plurality of memory cells arranged in rows and columns and grouped into multiple blocks of memory cells, where each block includes a subset of the memory cells. In some aspects, each subset of the memory cells includes one or more rows and two or more columns. The SRAM circuit further includes a plurality of column select circuits, where each column select circuit is operably connected to a respective block of memory cells. The SRAM circuit also include a plurality of y-decoder circuits, where each y-decoder circuit is operably connected to a respective column select circuit, and a first word line and a second word line operably connected to each row.

A static random access memory (SRAM) circuit can include an array of memory cells with a first word line and a second word line operably connected to each row in the array and a plurality of bit lines operably connected to the array of memory cells. A method of operating the SRAM circuit includes activating the first word line operably connected to a first row of memory cells in the array to select only a subset of selected memory cells in the first row of memory cells and activating a bit line in the plurality of bit lines to access a memory cell in the subset of selected memory cells. A read operation or a write operation is then performed on the memory cell accessed in the subset of selected memory cells.

What is claimed is:

1. A static random access memory (SRAM) circuit, comprising:
   a plurality of rows of memory cells and a plurality of columns of memory cells in a memory array, each row in the plurality of rows comprising a plurality of memory cells and each column in the plurality of columns including a plurality of memory cells;
   a plurality of bit lines operably connected to the plurality of memory cells in each column in the plurality of columns, wherein the plurality of bit lines comprises a plurality of first bit lines and a plurality of second bit lines and each column of memory cells is operably connected to a respective first bit line and to a respective second bit line;
   a plurality of first word lines operably connected to the plurality of rows; and
   a plurality of second word lines operably connected to the plurality of rows, wherein:
      a respective first word line and a respective second word line are connected to all memory cells in a respective row in a first subset of rows in the plurality of rows according to a first connection pattern; and
      a respective first word line and a respective second word line are connected to alternating memory cells in a respective row in a second subset of rows in the plurality of rows according to a second connection pattern that is different from the first connection pattern.

2. The SRAM circuit of claim 1, wherein the first subset of rows and the second subset of rows comprise all rows in the plurality of rows.

3. The SRAM circuit of claim 1, wherein the first connection pattern and the second connection pattern alternate connections to pass transistors in the memory cells in each row of the plurality of rows.

4. The SRAM circuit of claim 1, wherein:
   the plurality of memory cells in the row in the first subset of rows comprise a first memory cell and a second memory cell immediately adjacent to the first memory cell; and
   the first connection pattern operably connects:
      a first access transistor in the first memory cell to the respective first word line;
      a second access transistor in the first memory cell to the respective second word line;
      a first access transistor in the second memory cell to the respective second word line; and
      a second access transistor in the second memory cell to the respective first word line.

5. The SRAM circuit of claim 1, wherein:
   the plurality of memory cells in the row in the second subset of rows comprise a first memory cell and a second memory cell immediately adjacent to the first memory cell; and
   the second connection pattern operably connects:
      a first access transistor in the first memory cell to the respective first word line;
      a second access transistor in the first memory cell to the respective first word line;
      a first access transistor in the second memory cell to the respective second word line; and
      a second access transistor in the second memory cell to the respective second word line.

6. The SRAM circuit of claim 1, further comprising:
   at least one x-decoder circuit operably connected to the plurality of first and the plurality of second word lines; and
   a column select circuit operably connected to a portion of memory cells in the first and the second subsets of rows that are included in a common subset of columns in the memory array.

7. The SRAM circuit of claim 1, wherein each memory cell comprises a six transistor memory cell.

8. The SRAM circuit of claim 1, wherein the SRAM circuit comprises a single port SRAM circuit.

9. A static random access memory (SRAM) circuit, comprising:
   a plurality of memory cells arranged in rows and columns and organized into multiple blocks of memory cells with each block comprising a subset of the memory cells, each subset of the memory cells comprising one or more of the rows and two or more of the columns;
   first bit lines and second bit lines operably connected to the columns, wherein a respective column in the columns is operably connected to a respective first bit line and to a respective second bit line;
   a plurality of column select circuits, wherein a respective column select circuit in the plurality of column select circuits is operably connected to the respective first and the respective second bit lines of a respective block of memory cells;
   a plurality of y-decoder circuits, wherein a respective column select circuit is operably connected to a respective y-decoder circuit in the plurality of y-decoder circuits;
   a plurality of first word lines operably connected to the rows; and
   a plurality of second word lines operably connected to the rows, wherein:
      a respective first word line and a respective second word line are connected to all memory cells in a respective row in a first subset of the rows according to a first connection pattern; and
      a respective first word line and a respective second word line are connected to alternating memory cells in a respective row in a second subset of the rows according to a second connection pattern that is different from the first connection pattern.

10. The SRAM circuit of claim 9, further comprising one or more x-decoder circuits operably connected to respective first and respective second word lines.

11. The SRAM circuit of claim 10, wherein each memory cell comprises a six transistor memory cell.

12. The SRAM circuit of claim 10, wherein the SRAM circuit comprises a single port SRAM circuit.

13. The SRAM circuit of claim 9, wherein the first connection pattern and the second connection pattern vary connections between the respective first and the respective second word lines and the memory cells in a respective row along the respective row.

14. The SRAM circuit of claim 13, wherein each row in the first subset of the rows and each row in the second subset of the rows each comprises a first memory cell and a second memory cell immediately adjacent the first memory cell.

15. The SRAM circuit of claim 14, wherein:
the first and the second memory cells each comprise a first access transistor and a second access transistor; and
the first connection pattern operably connects:
the first access transistor in the first memory cell to the respective first word line;
the second access transistor in the first memory cell to the respective second word line;
the first access transistor in the second memory cell to the respective second word line; and
the second access transistor in the second memory cell to the respective first word line.

16. The SRAM circuit of claim 14, wherein:
the first and the second memory cells each comprise a first access transistor and a second access transistor; and
the second connection pattern operably connects:
the first access transistor in the first memory cell to the respective first word line;
the second access transistor in the first memory cell to the respective first word line;
the first access transistor in the second memory cell to the respective second word line; and
the second access transistor in the second memory cell to the respective second word line.

17. A method of operating a static random access memory (SRAM) circuit, the SRAM circuit comprising an array of memory cells with first word lines and second word lines operably connected to the array of memory cells and first bit lines and second bit lines operably connected to the array of memory cells, the method comprising:
activating a respective first word line and a respective second word line operably connected to a first row of memory cells in the array to select all of the memory cells in the first row of memory cells, the respective first word line connected to a first access transistor of each memory cell in a first subset of memory cells in the first row and to a second access transistor of each memory cell in a second subset of memory cells in the first row, and the respective second word line connected to the second access transistor of each memory cell in the first subset and to the first access transistor of each memory cell in the second subset;
activating a respective second word line connected to alternating memory cells in a different second row of memory cells to select only a third subset of memory cells in the second row of memory cells, the respective second word line connected to the first access transistor and to the second access transistor of each memory cell in the third subset;
activating a respective first bit line and a respective second bit line to access a first memory cell in the first subset of memory cells;
activating another respective first bit line and another respective second bit line to access a second memory cell in the third subset of memory cells; and
performing a read operation or a write operation on the first and the second memory cells.

18. The method of claim 17, wherein:
activating the respective first and the respective second bit lines comprises receiving a first y-select signal at a first column select circuit operably connected to the respective first and to the respective second bit lines; and
activating the another respective first bit line and the another respective second bit line comprises receiving a second y-select signal at a second column select circuit operably connected to the another respective first bit line and the another respective second bit line.

19. The method of claim 17, wherein:
activating the respective first word line and the respective second word line operably connected to the first row of memory cells comprises receiving a first x-address signal at a first x-decoder circuit operably connected to the respective first and the respective second word lines; and
activating the respective second word line operably connected to the second row of memory cells comprises receiving a second x-address signal at a second x-decoder circuit operably connected to the respective second word line.

20. The method of claim 17, wherein:
each memory cell comprises a six transistor memory cell; and
the SRAM circuit comprises a single port SRAM circuit.

* * * * *

UNITED STATES PATENT AND TRADEMARK OFFICE
CERTIFICATE OF CORRECTION

PATENT NO. : 11,152,057 B2
APPLICATION NO. : 16/507917
DATED : October 19, 2021
INVENTOR(S) : Fujiwara et al.

It is certified that error appears in the above-identified patent and that said Letters Patent is hereby corrected as shown below:

On the Title Page

Column 1, item (60), under "Related U.S. Application Data", Line 1, delete "16/507,917," and insert -- 62/698,649, --.

In the Specification

Column 4, Line 25, delete "106B, 106M" and insert -- 106B, . . . , 106M --.

Column 5, Line 1, delete "N1" and insert -- N1. --.

Column 9, Line 55, delete "BWL[l]" and insert -- BWL[1] --.

Signed and Sealed this
Twenty-eighth Day of June, 2022

Katherine Kelly Vidal
*Director of the United States Patent and Trademark Office*